INVENTOR.
PAUL A. RUGGERIO

*INVENTOR.*
PAUL A. RUGGERIO

United States Patent Office 3,716,363
Patented Feb. 13, 1973

3,716,363

METHOD OF MAKING PHOTOMASKS OF THE TYPE USED IN THE FABRICATION OF MICROELECTRONIC CIRCUITS

Paul A. Ruggerio, Auburn, Mass., assignor to GTE Laboratories Incorporated, Bayside, N.Y.

Filed Feb. 5, 1971, Ser. No. 112,940
Int. Cl. G03c 5/24, 5/26, 5/30
U.S. Cl. 96—66 R 13 Claims

ABSTRACT OF THE DISCLOSURE

A method of making photomasks containing lines of various widths for use in the fabrication of microelectronic circuits. The method utilizes a two-step development process to essentially eliminate the effects of optical diffraction and provide both thick and thin lines having a high degree of acutance, density and dimension control. The first development step utilizes a low-contrast developer to produce a nearly constant-density image over a wide exposure latitude. The second step employs a high-contrast developer which enhances the density in areas developed by the first step.

BACKGROUND OF THE INVENTION

This invention relates to a method of developing photoimages wherein the effects of optical diffraction are essentially eliminated and, in particular, to a method of making photomasks for use in fabricating microelectronic circuits.

The term microphotography refers to a process for making greatly reduced photographs of objects by optical reduction. The subject in microphtography is typically an engineering drawing transferred to a high-contrast transparent material which is greatly enlarged and represents the physical configuration of the finished work. In industrial applications intended to aid in selectively etching, chemical milling, or plating small devices, the micronegative is often used to transfer a very precise photographic image to a material coated with photosensitive resist. After the processing of the photosensitive resist image the material can be etched, milled or plated as desired.

The increasing interest in the field of microphotography is due to the recent growth of the microelectronics field wherein a multiplicity of electrical components are formed in a small area on a semiconductor substrate. The fabrication of microelectronic circuits requires the making of masks to control the exposure of photoresistive layers and from the desired image thereon. The masks are normally made by constructing a large pattern and then reducing it and forming a mask containing a number of identical images through "step-and-repeat" techniques. The "step-and-repeat" technique enables the major effort to be expended in developing one precise piece of artwork which is photographically reduced to form an intermediate master for the "step-and-repeat" process. The desired array is then normally provided by exposing the final photographic plate a number of times with the plate being moved in a controlled manner during the exposure process.

The preparation of photomasks for the fabrication of microelectronic circuits is essentially the imaging of luminous slits on a plate containing a photographic emulsion. Since the pattern normally contains lines of different widths some of which approach the typical Airy Disk radius, 1 to 3 microns, the effects of optical diffraction cause two primary problems which have theretofore been difficult to overcome. The first problem is due to the loss in acutance at the edge of the lines due to variations in edge density and a spreading of the image. As the lines decrease in width, the spread begins to approach the desired line width. Second, the aerial image lumination of a given area in a narrow line is less than the same area of a wider line. As a result, the exposure levels vary for lines of different thickness. However, the lines in the photomask are required to have essentially the same density and acutance for the proper exposure of the photoresistive coating. The failure to maintain acutance and density in the mask is transferred to the photoresist patterns and is primarily responsible for the formation of conductive paths of generally unpredictable resistivity and the occurrence of short circuits between adjacent paths.

To overcome the undesired diffraction effects, the exposure of lines of different widths have been varied to provide essentially constant density. One method of varying the exposure utilizes a plurality of different masks and enables the lines of different thicknesses to be separately exposed. Alternatively, the intensity of illumination has been varied while the exposure time is maintained constant by placing neutral density filters over the thicker lines. However, the exposure primarily determines the acutance and density of the resultant image and is affected by the environment of the line as well as the line thickness. Consequently, the proximity of lines and patterns must also be considered in an attempt to control exposure by varying time and/or intensity. In practice, these approaches are difficult, time-consuming, and expensive, and the establishment of a lower limit on permissable line thickness in microcircuit fabrication is favored.

The preparation of photomasks typically utilizes a concentrated emulsion of the Lippman type due to the ability of plates containing this emulsion to produce high density and acutance. These characteristics are obtained through the use of extremely small silver halide particles at high concentration within the gelatin layer. After exposure, the plates are processed in a high gamma developer to form a high contrast image. The term gamma refers to the slope of the tangent to the density versus log exposure curve for the particular emulsion and developer used and indicates the change in density for a change in exposure. Hereinafter the preparation of a photomask by this method will be referred to as standard processing. While the high contrast developers such as hydroquinone, metol or a solution thereof, are presently employed in microphotography to obtain high contrast in the developed image, the large variations in image density with relatively small changes in exposure generate significant problems where the intensity varies as a function of line width. For example, if the exposure which produces a 3.0 density image is reduced by a factor of two, the density figure of merit would decrease to 0.7.

The exposure variation produced by optical diffraction from a typical lens used in microphotography such as 16 mm., 0.25 numerical aperture objective, causes an intensity decrease of 3.5 times in going from a 6$\mu$ line to a 1$\mu$ line. Consequently, selective exposure or selective masking has been required to produce photomasks containing both thick and thin lines.

Accordingly, the present method is directed to a two-stage development process which essentially eliminates the effects of optical diffraction in the formation of photo-images. By compensating for the diffraction effects in the processing of the exposed emulsion rather than during the exposure step, the difficult steps of calculating mask densities, producing the masks and aligning these masks in the appropriate positions are unnecessary.

SUMMARY OF THE INVENTION

The present invention relates to a method of developing images on a photographic plate wherein the effects of optical diffraction occurring during the exposure of the plate are essentially eliminated. The method utilizes a two-stage development process to compensate for the different diffraction effects resulting from the exposure of lines of different widths.

After the completion of the exposure, the exposed plate containing the latent image is processed in a solution containing a first developing agent. The first agent is characterized by a low gamma and a wide exposure latitude. As a result, a low density image is formed on the plate. The image possesses a substantially constant density due to the wide exposure latitude provided by the first developing agent. In addition, the use of the first developing agent is found to prevent the development of low energy latent images proximate to the boundaries of the main images which normally degrade the acutance of the image and result in a lack of dimensional stability.

The term gamma used to characterize the developing agent is determined by the slope of the tangent to the density versus log exposure curve for the particular plate and developing solution employed. The gamma of the high contrast developing agents utilized in making photomasks from objects or masters containing both thin and thick lines, normally solutions containing hydroquinone and/or metol, is approximately 1.0 or higher. A low gamma developing agent (gamma less than 1.0), such as phenidone, provides a relatively small variation in image density over a wide range or latitude of exposures. Consequently, the image density of both thick and thin lines is substantially uniform after the first development stage.

After completion of the first stage, the plate is processed in a solution containing a second developing agent. The second agent is characterized by a high gamma and is utilized to enhance the relatively low density image formed by the first developing agent without causing any significant dimensional change in the image. Since the first developing agent is characterized by a wide exposure latitude, both thick and thin lines are developed to a substantially uniform, albeit low, density. Consequently, the variation in exposure levels experienced in making a photomask containing lines of different thicknesses is essentially eliminated by the solution containing the first developing agent which provides a uniform density image. The high gamma second agent enhances the low density of the image without regard to the optical diffraction effects occurring during the exposure of the photographic plate.

Further features and advantages of the present invention will become more apparent from the following detailed description of a specific embodiment when taken in conjunction with the accompanying drawings.

DESCRIPTION OF THE PREFERRED EMBODIMENT

Figure 1:
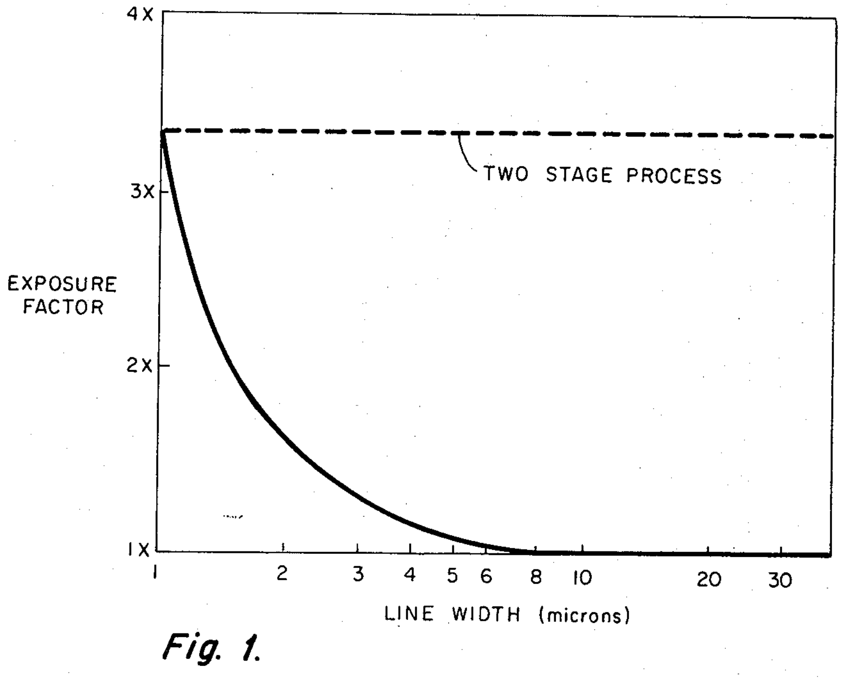
FIG. 1 shows the increase in exposure required for decreasing line widths for a typical reduction lens and development presently utilized in the fabrication of photomasks.

The present method of making photoimages, characterized by a high degree of acutance, density and dimensional control, utilizes a two-stage development technique for the exposed plate. The method is found well-suited for the preparation of photomasks for microelectronic circuits and the following description is with particular reference thereto. However, it will be recognized that the present method may be utilized in the development of other types of photoimages containing lines of varying widths.

In microelectronic mask-making, the emulsion contained in the photographic plate is normally capable of providing high resolution. However, the resolving power of photographic material is a threshold phenomena since lines in the narrowest image to be resolved may be degraded and unacceptable of producing a photomask. Consequently, high resolution materials which are also capable of producing high image density and acutance, such as concentrated Lippman emulsions, are generally employed. These characteristics are typically obtained by the use of a high concentration of small silver halide particles within the gelatin layer. These types of emulsion layers have a spectral sensitivity extending from the ultraviolet portion of the spectrum to wavelengths of about 6000 A. with peaks occurring near 5450 A.

The initial step in the fabrication of photomasks for microelectronic circuits includes the drawing of an individual master circuit pattern containing the outlines of the various conductive paths and diffusion windows. Typically, this pattern is 500 times the size of the resultant mask to facilitate the construction of the master. The master is normally constructed from red Rubylith material which is mounted on a clear plastic base. Since the reduction of the master is normally achieved through the use of a number of photographic reduction steps, the master may be either a positive or negative image.

When completed the master is partially reduced, normally to 1/10 of its original size. The initial reduction step is generally conducted without serious diffraction problems since the line widths in the first-reduced image are still relatively large, for example 50 to 100 microns. As a result, the aperture size of the lens is sufficiently large so that the detail of the image is not significantly degraded. Since the image definition is to be preserved throughout the series of reduction steps, the use of high resolution plates such as those employing concentrated Lippman emulsions is preferred.

The final reduction step typically finds the diffraction limits of the lens being exceeded since the lines that are to be resolved on the image are smaller than the equivalent Airy disk diameter. Therefore, lines of varying width will produce different exposure levels on the photographic emulsion. Since the process of this invention compensates for the different exposure levels during the processing of the photographic emulsion, the exposure for the final reduction step is chosen to be adequate for the narrowest lines to be reproduced.

FIG. 1 is a graph showing the exposure level required for a typical reducing lens (16 mm., 0.25 N.A.) to expose a photographic emulsion for various line widths. The ordinate scale represents the exposure increase factor, referenced to 1 $\times$; 1 $\times$ being the exposure level for line widths before diffraction occurs with standard processing. The solid line represents the exposure factor for various line widths using standard processing. Thus, for example, an increase in exposure level of more than three times is required to adequately expose a line having a width of 1 micron ($\mu$) as compared to a line having a width of 5$\mu$. For the two-stage process of this invention the entire final reduction step is carried out at an exposure factor calculated to provide adequate exposure for the narrowest line width to be reproduced. The dashed line in FIG. 1 shows that for a mask having 1-micron lines the final reduction step is carried out at an exposure factor of 3.25 ×.

After exposure, the photographic emulsion is emersed in a first developer which is chosen to have wide exposure latitude capabilities. The first developer produces a low, nearly uniform density image having low contrast between the exposed and unexposed portions of the photographic emulsion. After rinsing, the emulsion is emersed in a high-contrast second developer which enhances the density of the images only in those areas where development was begun by the first solution.

While the mechanism by which development occurs in the two-stage development process is not fully understood it is believed that development in the first developer is confined to the emulsion surface. Broadening of the wider lines during standard processing is believed to be due to development of latent images in the body of the emulsion which are exposed due to back reflection from the emulsion-glass interface of the photographic plate. Since the action of the first developer is confined to the emulsion surface these latent images are not developed in the two-stage process. The high-contrast second developer continues the development and intensifies the image only in those areas where development was initiated by the first developer.

Figure 2:
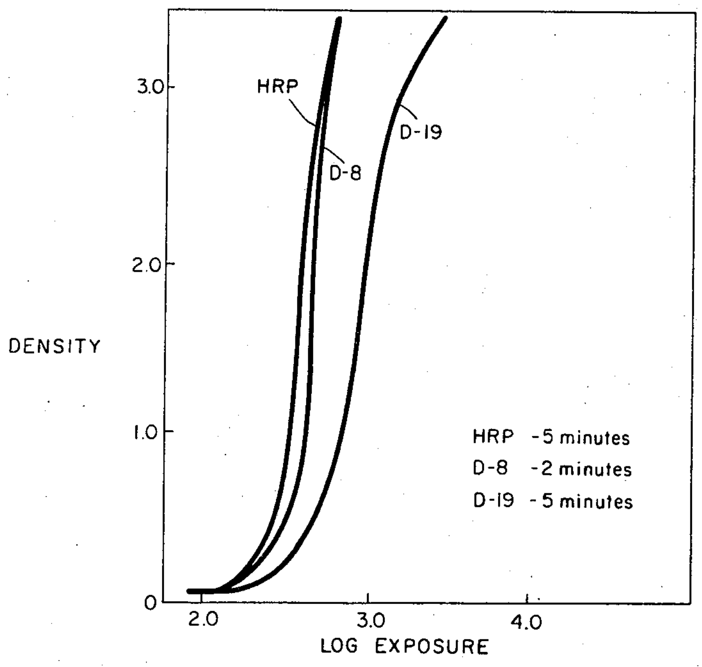
FIG. 2 shows the characteristic curves for commercially available high gamma developers.

Referring to FIG. 2, the curves labelled HRP, D–8 and D–19 show variations of density and log exposure for three well known, high-contrast high-gamma developers manufactured by the Eastman Kodak Company. The development time for each developer is indicated. The amount of contrast produced by a photographic developer is often expressed as the gamma of the developer; the gamma of the high-contrast developers of FIG. 2 being the slope of the tangent to the straight line portion of the density versus log exposure characteristic. Typically, a high-contrast developer has a gamma greater than 1.0 while a low-contrast developer has a gamma below 1.0.

After being removed from the second developer solution, the photographic plate is then put successively in a stop bath and then in a fixer after which it is washed and dried. For a more complete understanding of the present invention, reference is now made to the following specific example illustrating the method used.

EXAMPLE

First developer solution

| | Grams |
|---|---|
| Phenidone (1-phenyl-3 pyrazolidone) | 3.0 |
| Sodium sulfite | 35.0 |

Water (distilled), 1.0 liter.

Second developer solution

The second developer may be any well known high-energy developer used for standard processing containing a hydroquinone or metol-hydroquinone developing agent, an activator such as sodium hydroxide and a preservative such as sodium sulfite. In addition, the developer may contain an anti-fog agent such as potassium bromide. A typical high-energy developer has the following composition:

| | | |
|---|---|---|
| Water, about 90° F. (32° C.) | c.c. | 750 |
| Sodium sulfite, desiccated | g. | 90.0 |
| Hydroquinone | g. | 45.0 |
| Sodium hydroxide (caustic soda) | g. | 37.5 |
| Potassium bromide | g. | 30.0 |

Cold water to make 1.0 liter.

For use take 3 parts developer to 2 parts water.

Processing data

The emulsion is placed in the first developer solution for 3 to 5 minutes at 68° F. after which it is removed and rinsed in water for 5 to 10 seconds. Next, the emulsion is placed in the second developer solution at 68° F. for 1 to 2 minutes. After removal from the second developer solution the emulsion is placed in a standard stop bath of the following composition:

| | | |
|---|---|---|
| Water | l. | 1.0 |
| Acetic acid (28%) | c.c. | 125.0 |

After one minute the emulsion is removed from the stop bath and placed in a fixer of the following composition:

| | | |
|---|---|---|
| Water, about 125° F. (50° C.) | c.c. | 600 |
| Sodium thiosulfate (hypo) | g. | 240.0 |
| Sodium sulfite, desiccated | g. | 15.0 |
| Acetic acid (28%) | c.c. | 48.0 |
| Boric acid, crystals | g. | 7.5 |
| Potassium alum | g. | 15.0 |

Cold water to make 1.0 liter.

After 3 to 5 minutes the emulsion plate is removed from the fixer and again washed in water and dried. The plate is now ready for use.

A number of photographic images were produced at various exposure levels for various line widths using standard processing and the two-stage development process. The density of these lines were recorded as density tracings by a scanning microdensitometer and are shown in FIGS. 3 and 4.

Figure 3:
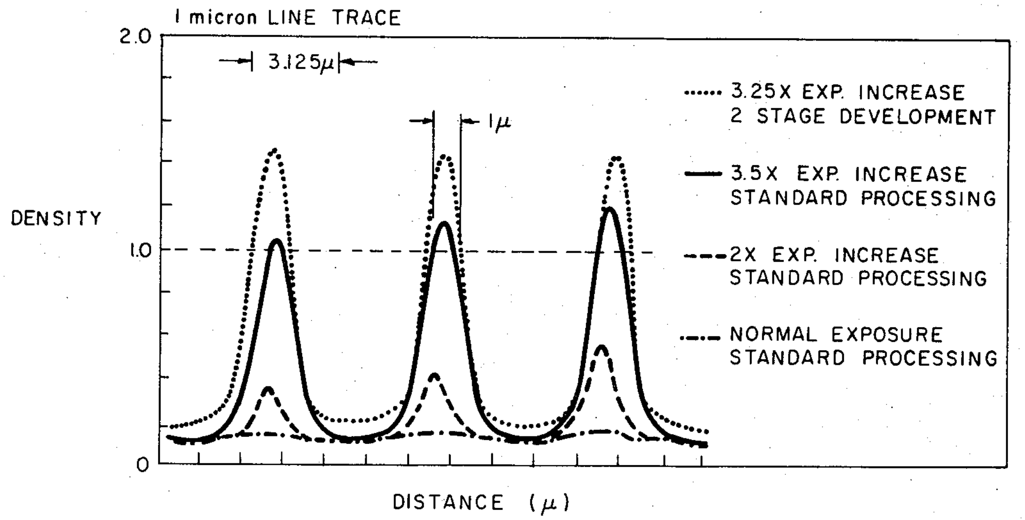
FIGS. 3 and 4 show comparative density tracings of 1 micron and 0.5 mil lines for different exposures.

FIG. 3 is a comparison of the density tracings of a series of 1 micron wide lines exposed at 1 ×, 2 × and 3.25 × exposure factors using standard processing compared with the density tracings for the two-stage development process and exposure at 3.25 ×. The horizontal straight line at 1.0 density represents the minimum masking density required for typical photoresists, such as Kodak Thin Film Resist, Kodak Metal Etch Resist, or Waycoat I.C. Resist.

Examination of FIG. 3 reveals that the 1× and 2× exposure levels are insufficient for producing proper masking using standard processing. With the exposure level increased to 3.25× the masking density is sufficient with either standard processing or the two-stage development process.

Figure 4:
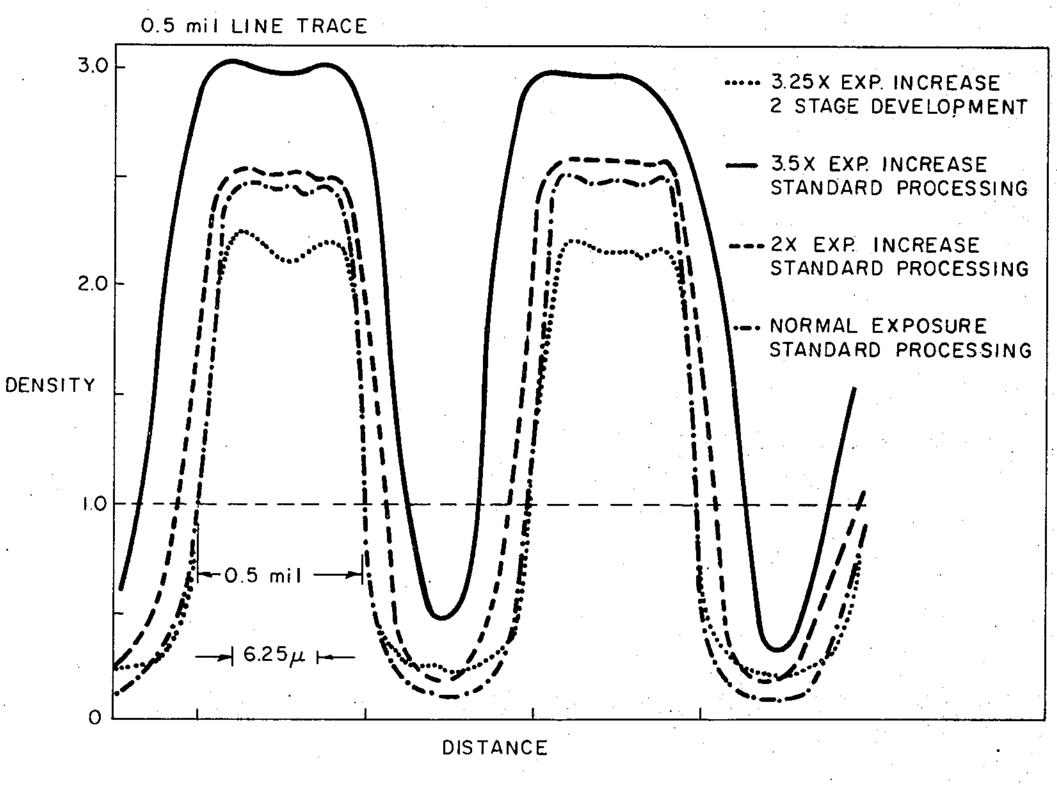

FIG. 4 is a comparison of density tracings for 0.5 mil wide lines separated by equal 0.5 mil spaces. Thus, although both standard processing and two-stage processing produces sufficient density at all exposure levels, considerable broadening of the 0.5 mil line occurs using standard processing at 3.25× exposure factor. The two-stage process preserves the 1:1 ratio at 3.25× exposure factor between the lines and the spaces. Comparison of FIGS. 3 and 4 indicates that if a mask having 1 micron wide lines and 0.5 mil lines were made using standard processing, either the density level of the 1 micron lines would not be sufficiently developed for use with a typical photoresist or the 0.5 mil lines would be significantly broadened causing inaccuracies in the microelectronic circuitry. The two-stage development process produces both the 1 micron line and the 0.5 mil lines with sufficient density, while maintaining the proper line width. Examples of density tracings of 0.1 mil and 0.2 mil wide lines separated by equal spaces obtained in the same way as those of FIG. 4 yield results similar to those shown.

In the preferred form of the invention the amount of phenidone can vary between 1.5 and 3.0 grams per liter of solution, although 1.0–10 grams/liter would produce good results. Experiments have shown that the amount of sodium sulfite per liter of solution of the first developer does not affect the results obtained and that the sodium sulfite merely acts as a preservative for the phenidone. For example, no significant variation in the final images was noted when using a first developer solution having 3 grams of phenidone and 0.5 gram of sodium sulfite per liter as compared with the first developer solution having 3 grams of phenidone and 30.0 grams of sodium sulfite.

What is claimed is:

1. A method of developing images on a photographic plate having a light sensitive emulsion wherein the effects of optical diffraction during the exposure of the plate are reduced comprising the steps of (a) processing the exposed plate in a first solution containing phenidone as a first developing agent, said first agent being characterized by a low gamma whereby a low contrast image having a substantially uniform low density is formed on the plate, and (b) processing the exposed plate in a second solution containing a second developing agent comprising hydroquinone of such concentration as to be characterized by a high gamma whereby the contrast of the image formed on said plate by the first agent is enhanced.

2. The method of claim 1 wherein said first solution further includes a preservative dissolved in water.

3. The method of claim 2 wherein the amount of phenidone is in the range 1.5 grams to 3 grams per liter of solution.

4. The method of claim 3 wherein said preservative is sodium sulfite.

5. The method of claim 1 wherein said second developing agent is selected from a group consisting of hydroquinone and metol-hydroquinone.

6. The method of claim 4 wherein said second solution consists essentially of hydroquinone, an activator and a preservative dissolved in water.

7. The method of claim 1 comprising the further steps of:

(a) rinsing said photographic plate with water before said plate is processed in said second solution, (b) immersing said photographic plate in a stop bath after said plate is processed in said second solution, and (c) immersing said photographic plate in a fixer bath after removal from said stop bath.

8. The method of claim 7 wherein said photographic plate is immersed in said first solution for a period of 3 to 5 minutes.

9. The method of claim 7 wherein said photographic plate is immersed in said second solution for a period of 1 to 2 minutes.

10. A method of developing images on a photographic plate having a light sensitive emulsion wherein said images are formed with a high degree of acutance, density and dimension control, comprising the steps of:

(a) immersing said plate in a low gamma developing solution until a low contrast image having a substantially uniform low density is formed on the plate, said developing solution consisting substantially of: phenidone, 3.0 grams; sodium sulfite, 35.0 grams; water, 1.0 liter; and (b) immersing said plate in a high gamma developing solution until the contrast of the image formed on said plate by said low gamma developing solution is enhanced, said high gamma solution consisting substantially of 2 parts water and 3 parts of stock solution, said stock solution consisting essentially of:

| | | |
|---|---|---|
| Water | c.c. | 750 |
| Sodium sulfite | g. | 90.0 |
| Hydroquinone | g. | 45.0 |
| Sodium hydroxide | g. | 37.5 |
| Potassium bromide | g. | 30.0 |

Cold water, 1.0 liter.

11. The method of claim 10 comprising the further steps of:

(a) rinsing said photographic plate with water before said plate is immersed in said high gamma developing solution;

(b) immersing said photographic plate in a stop bath after said plate is immersed in said high gamma developing solution; and (c) immersing said photographic plate in a fixer bath after removal from said stop bath.

12. The method of claim 11 wherein said photographic plate is immersed in said low gamma developing solution for a period of 3 to 5 minutes.

13. The method of claim 12 wherein said photographic plate is immersed in said high gamma developing solution for a period of 1 to 2 minutes.

References Cited

UNITED STATES PATENTS

| | | | |
|---|---|---|---|
| 2,289,367 | 7/1942 | Kendall | 96—66 HD |
| 3,671,246 | 6/1972 | Corben et al. | 96—66 |

NORMAN G. TORCHIN, Primary Examiner

M. F. KELLEY, Assistant Examiner

U.S. Cl. X.R.

96—50, 63 66 HD